United States Patent
Snyder et al.

(10) Patent No.: US 10,156,461 B2
(45) Date of Patent: Dec. 18, 2018

(54) METHODS AND APPARATUS FOR ERROR DETECTION IN A MAGNETIC FIELD SENSOR

(71) Applicant: Allegro MicroSystems, LLC, Manchester, NH (US)

(72) Inventors: Steven E. Snyder, New Boston, NH (US); Craig McConnell, Seattle, WA (US); Peter G. Wells, Bow, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 189 days.

(21) Appl. No.: 14/529,497

(22) Filed: Oct. 31, 2014

(65) Prior Publication Data
US 2016/0123780 A1 May 5, 2016

(51) Int. Cl.
*G01R 33/09* (2006.01)
*G01P 3/487* (2006.01)
(Continued)

(52) U.S. Cl.
CPC ............... *G01D 18/00* (2013.01); *G01D 5/14* (2013.01); *G01P 3/487* (2013.01); *G01P 3/488* (2013.01);
(Continued)

(58) Field of Classification Search
CPC .......... G01D 18/00; G01D 5/14; G01P 3/487; G01P 3/488; G01P 13/045; G01P 21/02;
(Continued)

(56) References Cited

U.S. PATENT DOCUMENTS 3,398,366 A   8/1968  Apfelbeck
4,004,217 A   1/1977  Giffard
(Continued)

FOREIGN PATENT DOCUMENTS

DE   42 27 113 A1   2/1994
DE   44 05 801 A1   8/1995
(Continued)

OTHER PUBLICATIONS

PCT Search Report and Written Opinion dated Sep. 19, 2008; for PCT Pat. App. No. PCT/US2008/067060; 14 pages.
(Continued)

*Primary Examiner* — Patrick Assouad
*Assistant Examiner* — Khristopher Yodichkas
(74) *Attorney, Agent, or Firm* — Daly, Crowley, Mofford & Durkee, LLP

(57) ABSTRACT

A magnetic field sensor for detecting motion of an object includes error detection circuiting and processing. Magnetic field sensing elements are configured to generate at least two magnetic field signals in response to a magnetic field associated with the object which signals are used by detectors to generate right and left channel signals with edges indicative of motion of the object. A direction calculation processor responsive to right and left channel signals generates a direction signal having a state indicative of a direction of motion of the object and an output signal generator generates an output signal having a pulse indicative of the direction of motion of the object in response to the direction signal. An error detection processor responsive to the output signal and to the direction signal is configured to detect an error in at least one of the direction signal and the output signal.

19 Claims, 8 Drawing Sheets

(51) Int. Cl.
  *G01P 13/04* (2006.01)
  *G01P 3/488* (2006.01)
  *G01D 18/00* (2006.01)
  *G01D 5/14* (2006.01)
  *G01P 21/02* (2006.01)

(52) U.S. Cl.
  CPC ............ *G01P 13/045* (2013.01); *G01P 21/02* (2013.01); *G01R 33/093* (2013.01); *G01R 33/096* (2013.01); *G01R 33/098* (2013.01)

(58) Field of Classification Search
  CPC ... G01R 33/093; G01R 33/096; G01R 33/098
  USPC .................................................. 324/207.52
  See application file for complete search history.

(56) References Cited

U.S. PATENT DOCUMENTS

| | | |
|---|---|---|
| 5,729,476 A | 3/1998 | Pfau |
| 5,793,778 A | 8/1998 | Qureshi |
| 5,854,598 A | 12/1998 | De Vries et al. |
| 5,917,320 A | 6/1999 | Scheller et al. |
| 6,091,239 A | 7/2000 | Vig et al. |
| 6,191,608 B1 | 2/2001 | Hennig et al. |
| 6,288,567 B1 | 9/2001 | Fink |
| 6,297,627 B1 | 10/2001 | Towne et al. |
| 6,420,868 B1 | 7/2002 | Ganther, Jr. et al. |
| 6,542,847 B1 | 4/2003 | Lohberg et al. |
| 6,545,495 B2 | 4/2003 | Warmack et al. |
| 6,687,644 B1 | 2/2004 | Zinke et al. |
| 6,693,419 B2 | 2/2004 | Stauth et al. |
| 6,815,944 B2 | 11/2004 | Vig et al. |
| 6,968,484 B2 | 11/2005 | Hummel |
| 6,980,005 B2 | 12/2005 | Finlay, Sr. et al. |
| 7,026,808 B2 | 4/2006 | Vig et al. |
| 7,096,386 B2 | 8/2006 | Ozawa |
| 7,184,876 B2 | 2/2007 | Teulings et al. |
| 7,199,579 B2 | 4/2007 | Scheller et al. |
| 7,319,418 B2 | 1/2008 | Fink |
| 7,327,153 B2 | 2/2008 | Weinraub |
| 7,466,123 B2 | 12/2008 | Kato et al. |
| 7,694,200 B2 | 4/2010 | Forrest et al. |
| 7,800,389 B2 | 9/2010 | Friedrich et al. |
| 8,299,783 B2 | 10/2012 | Fernandez et al. |
| 8,624,588 B2 | 1/2014 | Vig et al. |
| 2001/0002791 A1 | 6/2001 | Tsuge et al. |
| 2002/0017926 A1 | 2/2002 | Saito |
| 2002/0109501 A1 | 8/2002 | Schroeder |
| 2002/0196052 A1 | 12/2002 | Furuya |
| 2003/0227400 A1 | 12/2003 | Giddens et al. |
| 2004/0059959 A1 | 3/2004 | Ozawa |
| 2007/0096759 A1 | 3/2007 | Weinraub |
| 2007/0188245 A1 | 8/2007 | Kraemer et al. |
| 2008/0133158 A1 | 6/2008 | Koo |
| 2008/0303468 A1 | 12/2008 | Muller |
| 2010/0026279 A1* | 2/2010 | Vig .......................... G01P 3/488 324/173 |
| 2010/0103006 A1 | 4/2010 | Miyake et al. |
| 2010/0241302 A1 | 9/2010 | Shimizu |
| 2011/0048102 A1* | 3/2011 | Fernandez ........... G01D 5/2448 73/1.79 |
| 2011/0290036 A1 | 12/2011 | Pflum |
| 2011/0298448 A1 | 12/2011 | Foletto et al. |
| 2011/0298449 A1* | 12/2011 | Foletto ............... G01D 5/24452 324/207.13 |
| 2012/0274563 A1 | 11/2012 | Olsson |
| 2013/0265036 A1 | 10/2013 | Friedrich et al. |
| 2013/0320970 A1* | 12/2013 | Foletto ................. G01D 5/2448 324/251 |
| 2013/0335069 A1 | 12/2013 | Vig et al. |
| 2014/0009144 A1 | 1/2014 | Romero |
| 2014/0062358 A1 | 3/2014 | Reynolds et al. |
| 2014/0084903 A1 | 3/2014 | Vig et al. |
| 2014/0084904 A1 | 3/2014 | Vig et al. |

FOREIGN PATENT DOCUMENTS

| | | |
|---|---|---|
| DE | 44 444 08 A1 | 6/1996 |
| DE | 10 2004 006268 A1 | 9/2004 |
| EP | 1 580 561 | 9/2005 |
| EP | 1662353 | 5/2006 |
| WO | WO/2006/056829 | 6/2006 |
| WO | WO 2016/069216 | 5/2016 |

OTHER PUBLICATIONS

U.S. Appl. No. 14/337,613, filed Jul. 22, 2014, Scheller et al.
Office Action dated Jul. 21, 2009; for U.S. Appl. No. 11/779,354; 8 pages.
Response filed Oct. 19, 2009; to Office Action dated Jul. 21, 2009; for U.S. Appl. No. 11/779,354; 15 pages.
Notice of Allowance dated Dec. 17, 2009; for U.S. Appl. No. 11/779,354; 5 pages.
PCT Search Report and Written Opinion of the ISA dated Sep. 19, 2009; of the ISA; for PCT/US2008/067060; 14 pages.
Invitation to pay additional fees with partial search report dated Dec. 7, 2015 for PCT Application No. PCT/US2015/037098; 9 pages.
Invitation to pay additional fees and Partial Search Report dated Feb. 5, 2016 for PCT Application No. PCT/US2015/054172; 8 pages.
Search Report and Written Opinion dated Apr. 11, 2016 for PCT Application No. PCT/US2015/037098, 25 pages.
PCT International Search Report and Written Opinion dated Apr. 11, 2016 corresponding to International Application No. PCT/US2015/037098; 25 Pages.
PCT International Preliminary Report dated Feb. 2, 2017 for International Application No. PCT/US2015/037098; 16 Pages.
Response to U.S. Non-Final Office Action dated Jan. 13, 2017 for U.S. Appl. No. 14/337,613; Response filed Apr. 12, 2017; 12 Pages.
European Communication pursuant to Rules 161 (1) and 162 EPC dated Mar. 1, 2017; for European Pat. App. 15736878.8; 2 pages.
International Preliminary Report on Patentability for PCT Application No. PCT/US2015/054172, 14 pages.
Search Report and Written Opinion dated Apr. 21, 2017 for PCT Application No. PCT/US2015/054172, 23 pages.
Office Action dated Jan. 13, 2017 for U.S. Appl. No. 14/337,613; 27 pages.
Response to European Office Action dated Mar. 1, 2017 for European Application No. 15736878.8; Response filed on Sep. 7, 2017; 12 pages.
Final Office Action dated Jul. 21, 2017 for U.S. Appl. No. 14/337,613; 21 pages.
Response to Final Office Action filed Aug. 14, 2017 for U.S. Appl. No. 14/337,613; 10 pages.
Notice of Allowance dated Aug. 25, 2017 for U.S. Appl. No. 14/337,613; 10 pages.
European Response to Communication dated Nov. 29, 2017 for European Application No. 15784210.5; 19 pages.
European Communication Pursuant to Article 94(3) EPC dated Jun. 13, 2018 for European Application No. EP 15736878.8.
European Response filed Aug. 22, 2018 for European Application No. 15736878.8; 17 pages.

* cited by examiner

METHODS AND APPARATUS FOR ERROR DETECTION IN A MAGNETIC FIELD SENSOR

CROSS REFERENCE TO RELATED APPLICATIONS

Not Applicable.

STATEMENT REGARDING FEDERALLY SPONSORED RESEARCH

Not Applicable.

FIELD

This disclosure relates generally to magnetic field sensors, and, more particularly, to magnetic field sensors and related techniques for detecting an error in the magnetic field sensor.

BACKGROUND

As is known, magnetic field sensors are used in a variety of applications. One example application is in rotation detector circuits where a magnetic field sensor is used to detect rotation of an object, such as a ferromagnetic object, for example, a gear or ring magnet. In rotation detector circuits, the magnetic field associated with the object is typically detected by a magnetic field sensing element, such as a Hall effect element or a magnetoresistance element, which provides a signal (i.e., a magnetic field signal) proportional to a detected magnetic field.

Some rotation detectors generate an output signal indicative of the speed of rotation of the object. Other rotation detector circuits generate an output signal indicative of a direction of rotation of the object as well. One such rotation detector is described in U.S. Pat. No. 8,624,588 entitled "Apparatus and Method for Providing an Output Signal Indicative of a Speed of Rotation and a Direction of Rotation as a Ferromagnetic Object" which is assigned to the assignee of the present disclosure and incorporate herein by reference in its entirety.

Rotation detectors are widely used in automobile control systems, for example to detect rotation of an automobile wheel for use in anti-lock braking systems. During manufacture and/or use, magnetic field sensors sometimes present failures. Failures may be due to manufacturing defects, design defects, latent failures, damage caused by handling or during use, or some combination thereof.

In safety critical applications such as automobiles, various specified safety standards are required to be met in order to guarantee internal functionality of sensors. Compliance with such standards is intended to improve overall functional safety and result in higher quality and lower field failure rates.

To meet certain safety standards, some magnetic field sensor integrated circuits (ICs) contain built-in self-test circuitry and implement related self-test techniques. Self-test features are particularly important to detect failures occurring after installation of the device into its intended environment since, after installation, there are limited test opportunities due to reduced access to IC and interference of testing with normal operation of the device.

SUMMARY

The present disclosure provides a magnetic field sensor with built-in error detection circuitry and associated methods capable of detecting errors in a direction signal and/or an output signal of the magnetic field sensor. The described circuitry and methods can be used when the magnetic field sensor is in use in its intended application as opposed to only during manufacturing or in a test environment.

In one aspect, a magnetic field sensor for detecting motion of an object includes a plurality of magnetic field sensing elements configured to generate at least two magnetic field signals in response to a magnetic field associated with the object. The magnetic field sensor additionally includes a first detector circuit responsive to at least one of the magnetic field signals and configured to generate a right channel signal having edges indicative of motion of the object and a second detector circuit responsive to at least one of the magnetic field signals and configured to generate a left channel signal having edges indicative of motion of the object. A direction calculation processor responsive to the right and left channel signals generates a direction signal having a state indicative of a direction of motion of the object and an output signal generator generates an output signal having a pulse indicative of the direction of motion of the object in response to the direction signal. An error detection processor responsive to the output signal and to the direction signal is configured to detect an error in at least one of the direction signal and the output signal.

The magnetic field sensor may include one or more of the following features. The direction signal may be generated in response to a state of the left channel signal occurring at an edge of the right channel signal. The output signal generator may include a pulse counter configured to generate the output signal pulse with a first predetermined duration to indicate a first direction of motion when the direction signal is in a first state and with a second predetermined duration to indicate a second direction of motion when the direction signal is in a second state. The detected error may be an error in the direction signal comprising an edge of the direction signal not coinciding with an edge of the right channel signal in which case the error detection processor may include an edge comparator responsive to the direction signal and to the right channel signal to provide a comparator output signal indicative of whether an edge of the direction signal coincides with an edge of the right channel signal.

The detected error may additionally or alternatively be an error in the output signal comprising the output signal pulse not having one of the first predetermined duration or the second predetermined duration corresponding to the direction of motion of the object. The error detection processor may include a pulse counter checker responsive to the direction signal and to the output signal and configured to generate a pulse count checker signal having a count value corresponding to the one of the first predetermined duration or the second predetermined duration corresponding to the direction of motion of the object. The error detection processor may include an error flag generator to generate an error flag signal in response to the output signal pulse having a duration that does not correspond to the count value of the pulse counter checker signal. The output signal generator may further include a memory device. The memory device may be configured to store one or more parameters such as an output signal pulse duration, an error reporting type, and an output signal off-time. At least one of the stored parameters may be user programmable.

The object may be comprised of a magnetic material and the magnetic field may be generated by the object. The object may be comprised of a ferromagnetic material and the magnetic field may be affected by movement of the object. The magnetic field sensor may include a magnet and the magnetic field may be generated by the magnet. The magnetic field sensing elements may be Hall effect elements and/or magnetoresistance elements, such as an anisotropic magnetoresistance (AMR) element, a giant magnetoresistance (GMR) element, a tunneling magnetoresistance (TMR) element, a magnetic tunnel junction (MTJ) element, or a spin valve element.

In another aspect, a method for detecting an error in a magnetic field sensor that detects motion of an object includes receiving at least two magnetic field signals generated in response to a magnetic field associated with the object, generating a right channel signal having edges indicative of motion of the object in response to at least one of the magnetic field signals, and generating a left channel signal having edges indicative of motion of the object in response to at least one of the magnetic field signals. The method includes generating a direction signal having a state indicative of a first or second direction of motion of the object in response to the right and left channel signals and generating an output signal having a pulse indicative of the direction of motion of the object in response to the direction signal. The method further includes detecting an error in at least one of the direction signal and the output signal.

Features of the method may include one or more of the following. Detecting the error may include detecting the error in the direction signal if an edge of the direction signal does not coincide with an edge of the right channel signal. Generating the direction signal may include generating the output signal pulse with a first predetermined duration to indicate a first direction of motion when the direction signal is in a first state and with a second predetermined duration to indicate a second direction of motion when the direction signal is in a second state. Detecting the error may include detecting the error in the output signal if the output signal pulse does not having the one of the first and second predetermined durations corresponding to the direction of motion of the object.

BRIEF DESCRIPTION OF THE DRAWINGS

The foregoing features of the disclosure, as well as the disclosure itself may be more carefully understood from the following detailed description of the drawings, which.

DETAILED DESCRIPTION

Figure 1:
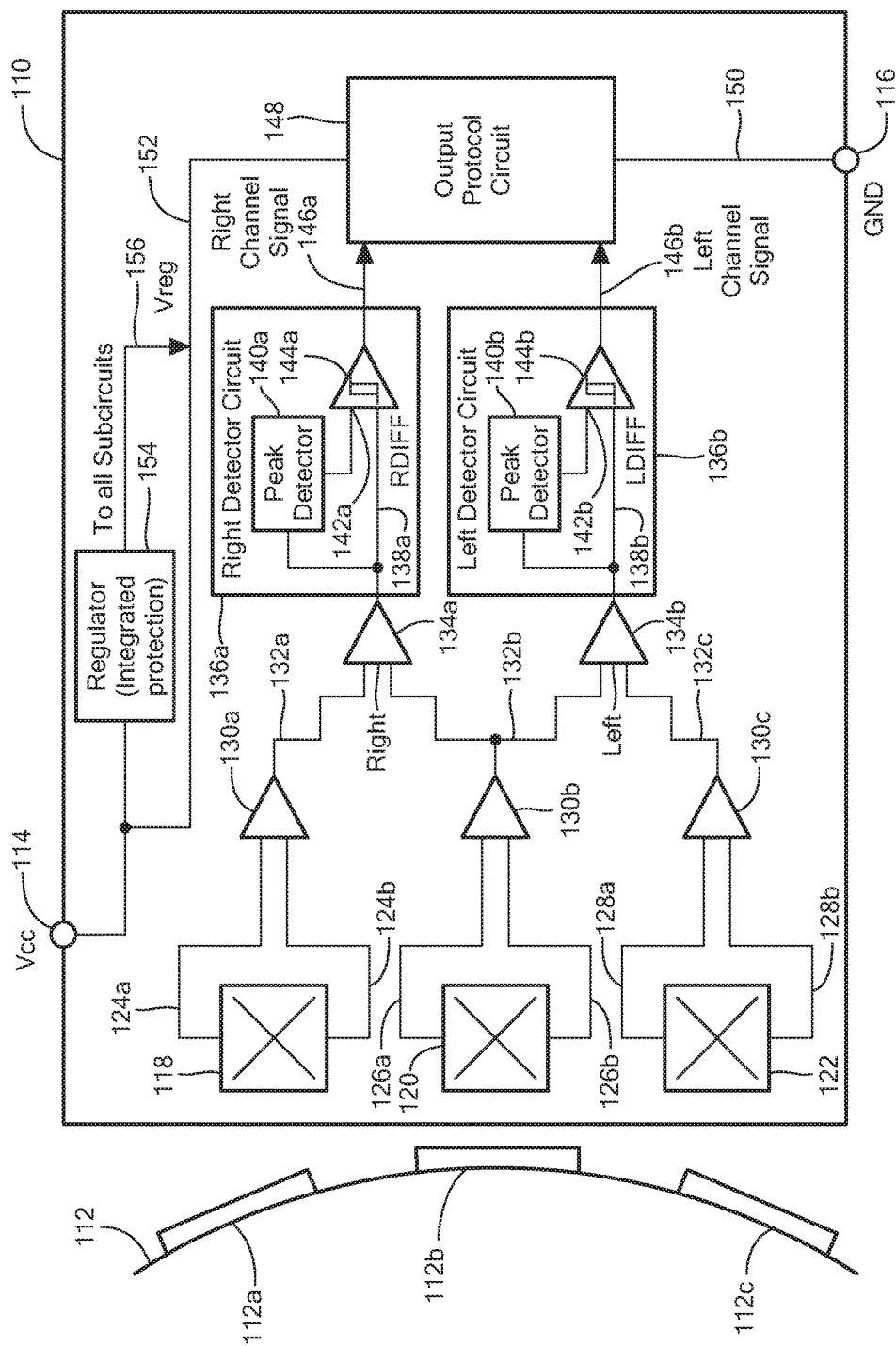
FIG. 1 is a block diagram of a magnetic field sensor for detecting motion of an object, the magnetic field sensor shown proximate to an example object.

The features and other details of the disclosure will now be more particularly described. It will be understood that any specific embodiments described herein are shown by way of illustration and not as limitations of the concepts, systems and techniques described herein. The principal features of this disclosure can be employed in various embodiments without departing from the scope of the concepts sought to be protected.

For convenience, certain introductory concepts and terms used in the specification are collected here.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog or digital.

Referring now to FIG. 1, a magnetic field sensor 110 capable of detecting motion (e.g., speed of rotation and/or direction of rotation) of an object, e.g., gear teeth 112a-112c of a ferromagnetic gear 112, is shown. The magnetic field sensor 110 may be implemented in the form of an integrated circuit containing the various components and circuiting supported by one or more substrates within a package. A first terminal 114 of the sensor 110 is adapted to couple to a power supply, denoted as Vcc, and a second terminal 116 is adapted to couple to a reference potential, such as ground, denoted as (GND). In some arrangements, the magnetic field sensor 110 is provided as a two terminal device for which an output signal 152 generated by the sensor 110 appears as a current signal superimposed on the power supply voltage, Vcc, at the first terminal 114. However, in other arrangements, the magnetic field sensor 110 has a third terminal (not shown) at which an output signal can be provided as a voltage or a current.

The magnetic field sensor 110 includes a plurality of magnetic field sensing elements, as indicated by first, second, and third magnetic field sensing elements 118, 120 and 122, respectively, in the example embodiment shown. The first magnetic field sensing element 118 is configured to generate a first differential signal 124a, 124b, the second magnetic field sensing element 120 is configured to generate a second differential signal 126a, 126b, and the third magnetic field sensing element 122 is configured to generate a third differential signal 128a, 128b in response to a magnetic field associated with the object 112. Although the magnetic field sensing elements 118, 120 and 122 are depicted as Hall effect elements, in some embodiments the magnetic field sensing elements 118, 120 and 122 are, for example, provided as magnetoresistance elements where the magnetoresistance elements may be an anisotropic magnetoresistance (AMR) element, a giant magnetoresistance (GMR) element, a tunneling magnetoresistance (TMR) element, a magnetic tunnel junction (MTJ) element, or a spin valve element. It should be appreciated that the magnetic field sensing elements 118, 120, 122 may take any form suitable for detecting motion of the object 112 by sensing a magnetic field affected by such motion.

The object 112 may be a ferromagnetic object. The ferromagnetic object can be a magnetic object and the magnetic field detected by the magnetic field sensing elements 118, 120, and 122 may be generated by the object itself and may vary depending on positions of the object 112 relative to the sensor 110. Alternatively, a separate source of a magnetic field may be provided (e.g., a permanent magnet or hard ferromagnetic material) as part of, or adjacent to the magnetic field sensor 110 and the magnetic field detected by the magnetic field sensing elements 118, 120, and 122 may be altered by movement of the ferromagnetic object.

Furthermore, although the object 112 is shown in the form of a ferromagnetic gear in the example embodiment, the object may take other forms. For example, the object 112 may take the form of a ring magnet having magnetic domains that are detected by the sensor 110. Additionally, the object 112 may be coupled to an automobile wheel, steering shaft, or a camshaft, as a few examples.

The magnetic field sensor 110 includes right and left channel circuitry to generate right and left channel signals 146a, 146b, each having edges indicative of motion of the object 112. The right channel circuitry includes a right channel amplifier 134a and a right detector circuit 136a and the left channel circuitry includes a left channel amplifier 134b and a left detector circuit 136b.

The designations "left" and "right" are arbitrary and indicate generally that two different signals are generated, each indicative of the magnetic field sensed at a different respective location relative to the object 112. In the illustrative embodiment, three magnetic field sensing elements 118, 120, and 122 are used for differential magnetic field sensing, with the central element 120 used in both channels. While three magnetic field sensing elements 118, 120, and 122 are shown, it should be appreciated that two or more magnetic field sensing elements can be used. For example, in an embodiment using only two magnetic field sensing elements, only magnetic field sensing element can be coupled to the right channel amplifier 134a and the other magnetic field sensing element can be coupled to the left channel amplifier 134b.

The magnetic field sensor 110 also includes a first differential preamplifier 130a coupled to receive the first differential signal 124a, 124b and to provide a first differential output signal 132a to a first input of the right channel amplifier 134a. A second differential preamplifier 130b is coupled to receive the second differential signal 126a, 126b and to provide a second differential output signal 132b to a second input of the right channel amplifier 134a and to a first input of the left channel amplifier 134b. A third differential preamplifier 130c is coupled to receive the third differential signal 128a, 128b and to provide a third differential output signal 132c to a second input of the left channel amplifier 134b.

Right detector circuit 136a and left detector circuit 136b are coupled to receive a right differential (RDIFF) output signal 138a generated by the right channel amplifier 134a and a left differential (LDIFF) output signal 138b generated by the left channel amplifier 134b, respectively, as shown. The right detector circuit 136a generates the right channel signal 146a having edges indicative of motion of the object 112 and the left detector circuit generates the left channel signal 146b having edges indicative of motion of the object 112. It will be appreciated that the phases of the right and left channel signals 146a, 146b will be offset from one another based on detection of the magnetic field at two different positions relative to the object 112.

Taking the right detector circuit 136a as representative of the right detector circuit 136a and the left detector circuit 136b, the right detector circuit 136a includes a peak detector circuit 140a and a comparator 144a, both coupled to receive the RDIFF signal 138a. The peak detector circuit 140a is configured to track positive and negative peaks of the RDIFF signal 138a and generate a threshold signal 142a in response to detected peaks. To this end, the peak detector 140a, 140b may include one or more digital-to-analog converters (DACs) to generate a tracking signal, which tracks the respective RDIFF signal 138a.

Still using the right detector circuit 136a as illustrative of both detector circuits 136a, 136b, the peak detector 140a make take various forms for example, peak detection 140a may take the form of a peak-to-peak percentage detector in which the threshold signal 142a is a percentage of the peak-to-peak RDIFF signal 138a. For this type of sensor, the right channel signal 146a provided at the output of the comparator 144a changes state when the RDIFF signal 138a crosses the threshold level 142a. One such peak-to-peak percentage detector is described in U.S. Pat. No. 5,917,320 entitled "Detection of Passing Magnetic Articles While Periodically Adapting Detection Threshold," which is assigned to the assignee of the present disclosure and incorporated herein by reference in its entirety. In an alternative embodiment, the peak detection 140a may take the form of a so-called slope-activated or peak-referenced detector in which the threshold 142a differs from the positive and negative peaks (i.e., the peaks and valleys) of the RDIFF signal output 138a by a predetermined amount. Thus, in this type of detector, the right channel signal 146a provided at the output of comparator 144a changes state when the RDIFF signal 138a departs from a peak and/or valley by the predetermined amount. One such slope-activated detector is described in U.S. Pat. No. 6,091,239 entitled "Detection of Passing Magnetic Articles with a Peak Referenced Threshold Detector," which is assigned to the assignee of the present disclosure and incorporated herein by reference in its entirety.

The left detector circuit 136b is configured to generate a left channel signal 146b in a manner similar to how the right detector circuit 136a generates the right channel signal 146a.

However, since the first and second magnetic field sensing elements 118, 120 contribute to the right channel signal 146a and the second and third magnetic field sensing elements 120, 122 contribute to the left channel signal 146b in the embodiment shown, it should be appreciated that the right and left channel signals 146a, 146b may have transition edges that differ in time (which is equivalent to phase for a particular signal frequency, i.e., particular rotation speed). A direction of rotation of the object 112 can be determined from a relative phase or relative time difference (e.g., lag or lead) of a particular edge transition in the right channel signal 146a compared with a corresponding edge transition in the left channel signal 146b.

The magnetic field sensor 110 further includes an output protocol circuit 148 coupled to receive the right channel signal 146a and the left channel signal 146b and configured to generate a direction signal (e.g., 250a, shown in FIG. 2) indicative of direction of rotation of the object 112 and an output signal 152 (e.g., as a current signal). As will be described, the output signal 152 may be indicative of a speed of motion of the object 112 and/or a direction of motion of the object. The output protocol circuit 148 includes circuitry and implements techniques to detect an error in at least one of the direction signal (e.g., 250a, shown in FIG. 2) and the output signal 152 and the output signal 152 may be indicative of a detected error.

Figure 2:
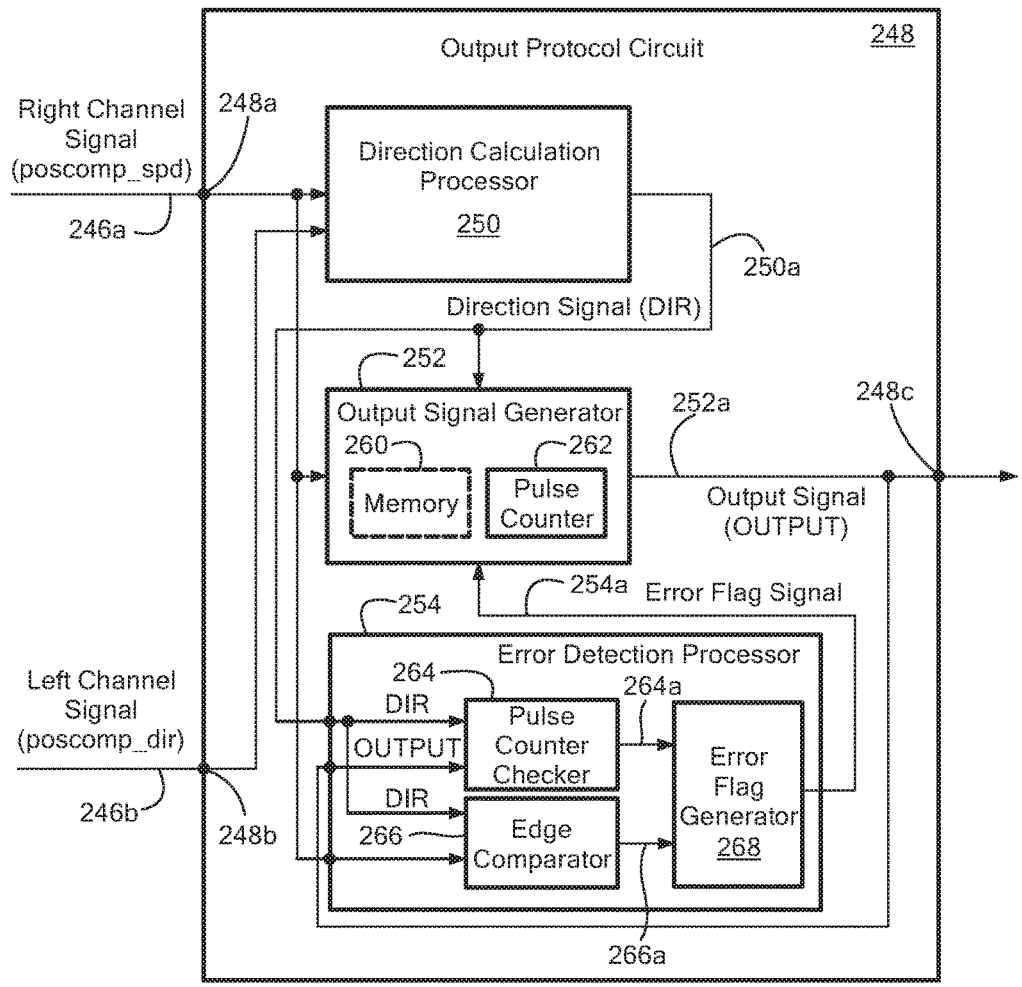
FIG. 2 is a block diagram of the output protocol circuit the magnetic field sensor of FIG. 1.

Referring to FIG. 2, an output protocol circuit 248, which can be the same as or similar to the output protocol circuit 148 (FIG. 1), is coupled to receive a right channel signal (also referred to herein as "poscomp_spd") 246a at a first input terminal 248a and a left channel signal (also referred to herein as "poscomp_dir") 246b at a second input terminal 248b. The right channel signal 246a and the left channel signal 246b, which can be the same as or similar to the right channel signal 146a and the left channel signal 146b, have edges indicative of motion of an object (e.g., object 112, shown in FIG. 1) detected by a magnetic field sensor (e.g., sensor 110, shown in FIG. 1).

The output protocol circuit 248 includes a direction calculation processor 250 having a first input coupled to the first input terminal 248a and a second input coupled to the second input terminal 248b. The direction calculation processor 250 receives the right channel signal 246a and the left channel signal 246b and is configured to generate a direction signal 250a having a state indicative of a direction of motion of the object (e.g., object 112, shown in FIG. 1) at an output thereof in response to the right channel signal 246a and the left channel signal 246b. In some embodiments, the direction signal 250a is generated in response to a state of the left channel signal 246b occurring at an edge of the right channel signal 246a.

The output protocol circuit 248 also includes an output signal generator 252 having a first input adapted to couple to the first input terminal 248a of the output protocol circuit 248 and a second input adapted to couple to the direction calculation processor output. The output signal generator 252 further includes a memory device 260 and a pulse counter 262 in the example embodiment shown. In some embodiments, however, the memory device 260 is optional and is thus shown in phantom. The output signal generator 252 is responsive to the right channel signal 246a and the direction signal 250a to generate an output signal 252a (also referred to herein as "OUTPUT") having a pulse indicative of the direction of motion of the object (e.g., object 112, shown in FIG. 1) at the output terminal 248c. The output signal 252a may also be indicative of the speed of motion of the object. In some embodiments, the output signal 252a is a two state square-wave signal having a frequency proportional to the speed of rotation of the object 112 and a duty cycle (or pulse width or on-time duration) representative of the direction of the rotation of the object. In other embodiments, the output signal 252a is provided in the form of a digital word representative of the speed of rotation of the object 112 and the direction of rotation. It will be appreciated however that various schemes are possible to communicate direction information in the output signal, such as those described in the above referenced U.S. Pat. No. 8,624,588.

The pulse counter 262, which can be a binary counter (e.g., an 8-bit binary counter) according to some embodiments, is configured to generate the output signal 252a with pulse having a duration indicative of the direction of the rotation of the object. For example, an output signal pulse having a first predetermined duration may indicate a first direction of motion when the direction signal 250a is in a first state and an output signal pulse having a second predetermined duration may indicate a second direction of motion when the direction signal 250a is in a second state. The pulse counter 262 may contain preset count values corresponding to the different possible output pulse durations.

The memory device 260 (e.g., EEPROM) is configured to store one or more parameters associated with the output signal format, such as an output signal pulse duration, an error reporting type, and an output signal off-time. The output signal off-time may, for example, be a predetermined delay in output signal pulses, as shown for example in FIG. 4A. In some embodiments, at least one of the stored parameters is user programmable.

The programmed output signal duration parameters may determine the first and second pulse durations used to indicate the first and second durations of motion for example. The programmed error reporting type may be used to specify a detected example, such as the error reporting of FIG. 4 in the alternative error pulse format of FIG. 4A as examples.

The output protocol circuit 248 additionally includes an error detection processor 254 having an edge comparator 266, an error flag generator 268 and a pulse counter checker 264. The error detection processor 254 has a first input adapted to couple to the first input terminal 248a of the output protocol circuit 248, a second input adapted to couple to the direction calculation processor output, and a third input adapted to coupled to the output terminal 248c. The error detection processor 254 is thus coupled to receive the right channel signal 246a, the direction signal 250a, and the output signal 252a and is configured to detect an error in at least one of the direction signal 250a and the output signal 252a.

In some embodiments, the detected error is an error in the direction signal 250a comprising an edge of the direction signal 250a not coinciding with an edge of the right channel signal 246a. To this end, the edge comparator 266a is coupled to receive the direction signal 250a at a first edge comparator input and the right channel signal 246a at a second edge comparator input. The edge comparator 266 is configured to generate a comparator output signal 266a indicative of whether an edge of the direction signal 250a does not coincide with an edge of the right channel signal 246a which determination can indicate an error.

Additionally, in some embodiments, the detected error is an error in the output signal 252a comprising an output signal pulse not having a predetermined duration (e.g., an output signal pulse not having one of the first predetermined duration or the second predetermined duration corresponding to the direction of motion of the object). The pulse counter checker 264 receives the direction signal 250a at a first input and the output signal 252a at a second input and is configured to generate a pulse count checker signal 264a having a count value corresponding to the one of a first predetermined duration corresponding to a first direction of motion when the direction signal 250a is in a first state or a second predetermined duration corresponding to a second direction of motion when the direction signal 250a is in a second state.

The detected error in the output signal may additionally or alternatively be an error in the output signal 252a comprising an output signal at a predetermined time as will be described.

The error flag generator 268 has a first input adapted to couple to the edge comparator output to receive the edge comparator signal 266a and a second input adapted to couple to the pulse counter checker 264 to receive the pulse counter checker signal 264a. The error flag generator 268 is configured to generate an error flag signal 254a in response to detection of an error by the edge comparator 266 and/or the pulse counter checker 264. The error flag signal 254a is coupled to the output signal generator 252 for encoding of the error information into the sensor output signal 252a.

The error flag signal 254a may be stored in the optional memory device 260 and may be conveyed in the sensor output signal 252a or otherwise in various formats and/or protocols. As one example, the error flag signal 254a may be conveyed in the form of a pulse having a predetermined pulse width in the output signal 252a corresponding to the particular error detected. As other examples, the output signal 252a may convey a detected error in the form of a substantially infinite pulse or in the form of a pulse with a voltage level that is substantially different than the voltage level of the pulse during error-free operation. Additionally or alternatively a detected error may indicated in other ways, such as in the form of an LED or other visual indicator or as a signal provided at a dedicated output pin.

An indication of a detected error may be provided to various circuitry internal to the magnetic field sensor (e.g., 110, shown in FIG. 1) that may respond to the error indication by taking various actions. As one example, circuitry internal to or external from the magnetic field sensor 110 can respond to an error indication by resetting the magnetic field sensor 110 in an attempt to clear the error. The error indication may additionally or alternatively be provided to circuits or systems external to the sensor 110, such as to an Engine Control Unit (ECU) of an automobile.

Figure 3:
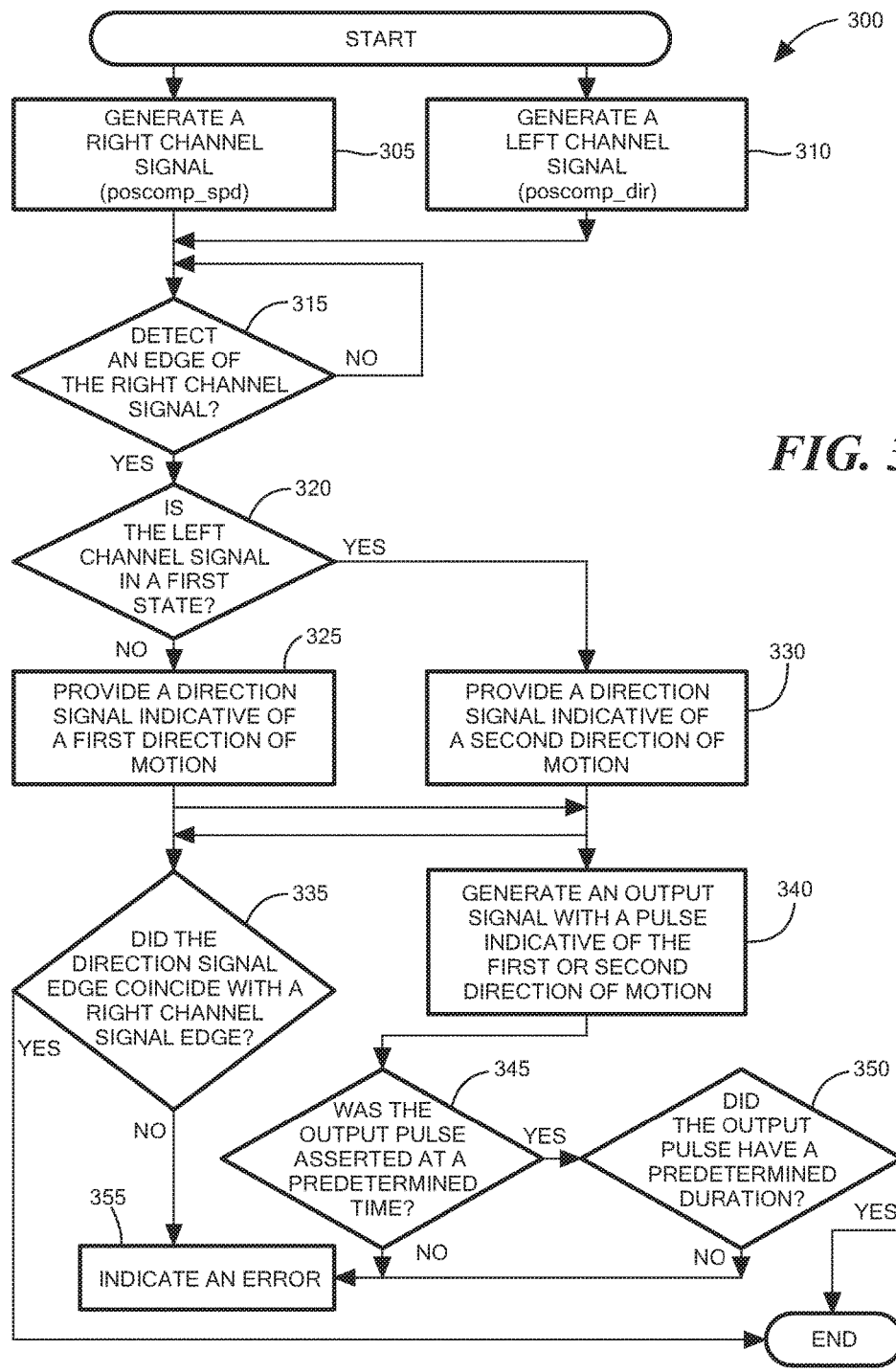
FIG. 3 is a flowchart illustrating a method for detecting an error in a magnetic field sensor that may be implemented in the magnetic field sensor of FIGS. 1 and 2.

Referring also to FIG. 3, a flowchart illustrates a method 300 for detecting an error in a magnetic field sensor that detects motion of an object (e.g., 112, shown in FIG. 1) that can be implemented in the magnetic field sensor 110 shown in FIG. 1 and the output protocol circuit 248 shown in FIG. 2, The result of the error detection may be an indication that the direction signal edge coincides or does not coincide with a right channel signal edge, the output pulse was or was not asserted at a predetermined time, and/or the output pulse has or does not have a predetermined duration.

Rectangular elements (typified by element 305 in FIG. 3), as may be to as "processing blocks," may represent computer software instructions or groups of instructions. Diamond shaped elements (typified by element 315 in FIG. 3), herein denoted "decision blocks," represent computer software instructions, or groups of instructions, which affect the execution of the computer software instructions represented by the processing blocks. The processing and decision blocks can represent steps performed by functionally equivalent circuits such as a digital signal processor circuit or an application specific integrated circuit (ASIC). The flow diagram does not depict the syntax of any particular programming language. Rather, the flow diagram illustrates the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa.

As illustrated in FIG. 3, a method 300 for detecting an error in a magnetic field sensor (e.g., magnetic field sensor 110, shown in FIG. 1) that detects motion of an object (e.g., object 112, shown in FIG. 1) begins at block 305 where a first detector circuit, which can be the same as or similar to the right detector circuit 136a of FIG. 1, generates a right channel signal, which can be the same as or similar to the right channel signal 146a of FIG. 1 and/or the right channel signal 246a of FIG. 2, having edges indicative of motion of the object. At block 310, a second detector circuit, which can be the same as or similar to the left detector circuit 136b of FIG. 1, generates a left channel signal, which can be the same as or similar to the left channel signal 146b of FIG. 1 and/or the left channel signal 246b of FIG. 2, having edges indicative of motion of the object.

At block 315, a direction calculation processor, which can be the same as or similar to the direction calculation processor 250 of FIG. 2, detects an edge of the right channel signal. If the direction calculation processor detects an edge of the right channel signal, the method proceeds to a block 320. Alternatively, if the direction calculation processor does not detect an edge of the right channel signal, block 315 is repeated.

At block 320, the direction calculation processor 250 determines if the left channel signal 246b is in a first state. If the direction calculation processor determines that the left channel signal is in a first state, the method proceeds to a block 330, where the direction calculation processor provides a direction signal (e.g., 250a, shown in FIG. 2) indicative of a second direction of motion of the object to an output signal generator (e.g., 252, shown in FIG. 2) and an error detection processor (e.g., 254, shown in FIG. 2).

Alternatively, if the direction calculation processor determines that the left channel signal is not in a first state, the method proceeds to a block 325, where the direction calculation processor provides a direction signal (e.g., 250a, shown in FIG. 2) indicative of a first direction of motion to an output signal generator (e.g., 252, shown in FIG. 2) and an error detection processor (e.g., 254, shown in FIG. 2).

In example embodiments where only an edge of the right channel detected in a block 315 is to be compared with an edge of the direction signal (e.g., 250a, shown in FIG. 2), error detection commences at a block 335 where it is determined whether an edge of the direction signal coincides with the right channel signal edge detected in a block 315. If an edge of the direction signal does not coincide with a right channel signal edge, the method proceeds to a block 355 where an error in the direction signal is indicated. As previously discussed, the magnetic field sensor (e.g., 110, shown in FIG. 1) may provide an indicator of the error, such as in the output signal (e.g., 252a, shown in FIG. 2). Alternatively, if it is determined that an edge of the direction signal coincides with the right channel signal edge, the method ends. The method ending may, for example, be indicative an error not being detected in the magnetic field sensor and may indicate an end to a single error detection processing cycle in which case the process 300 may be repeated continuously, periodically, or in response to a command signal depending on system and application requirements.

Alternatively, in embodiments where an error in the output signal (e.g., 252a, shown in FIG. 2) is to be detected, the method proceeds to a block 340, where the output signal generator (e.g., 252, shown in FIG. 2) generates an output signal with a pulse indicative of either the first or the second direction of motion in response to receiving at least the direction signal provided in block 325 or block 330.

At block 345, it is determined whether or not the output pulse is asserted at a predetermined time. If it is determined that the output pulse was asserted at a predetermined time, the method proceeds to a block 350. Alternatively, if it is determined that the output pulse was not asserted at a predetermined time, the method proceeds to a block 355 where an error in the output signal is indicated.

At block 350, it is determined whether or not the output pulse has a predetermined duration. If it is determined that the output pulse does not have a predetermined duration, the method proceeds to a block 355 where an error in the output signal is indicated. Alternatively, if it is determined that the output pulse has a predetermined duration, the method ends.

Figure 4:
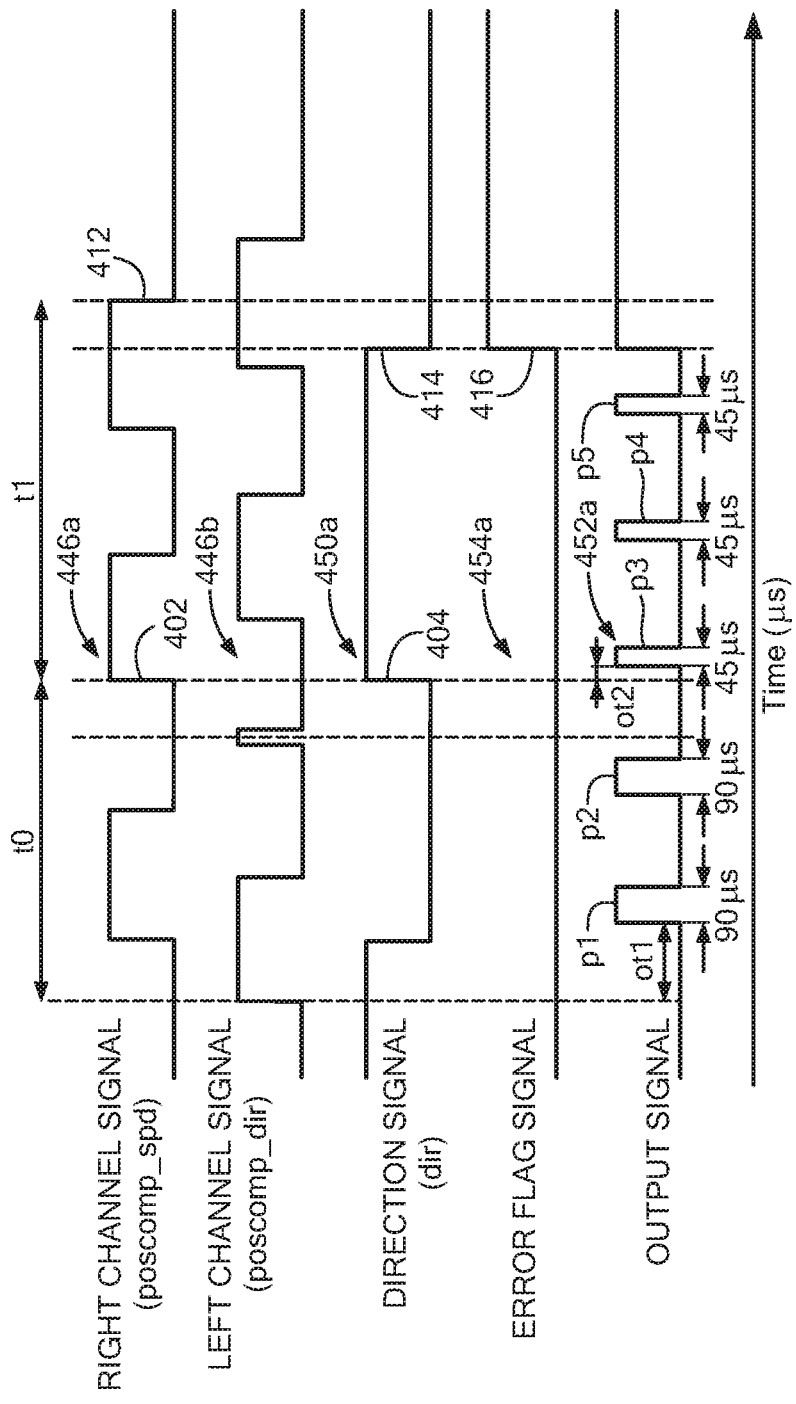
FIG. 4 shows illustrative signal waveforms generated by the magnetic field sensor of FIGS. 1 and 2 in response to an error in a direction signal and in accordance with an embodiment.
Figure 5:
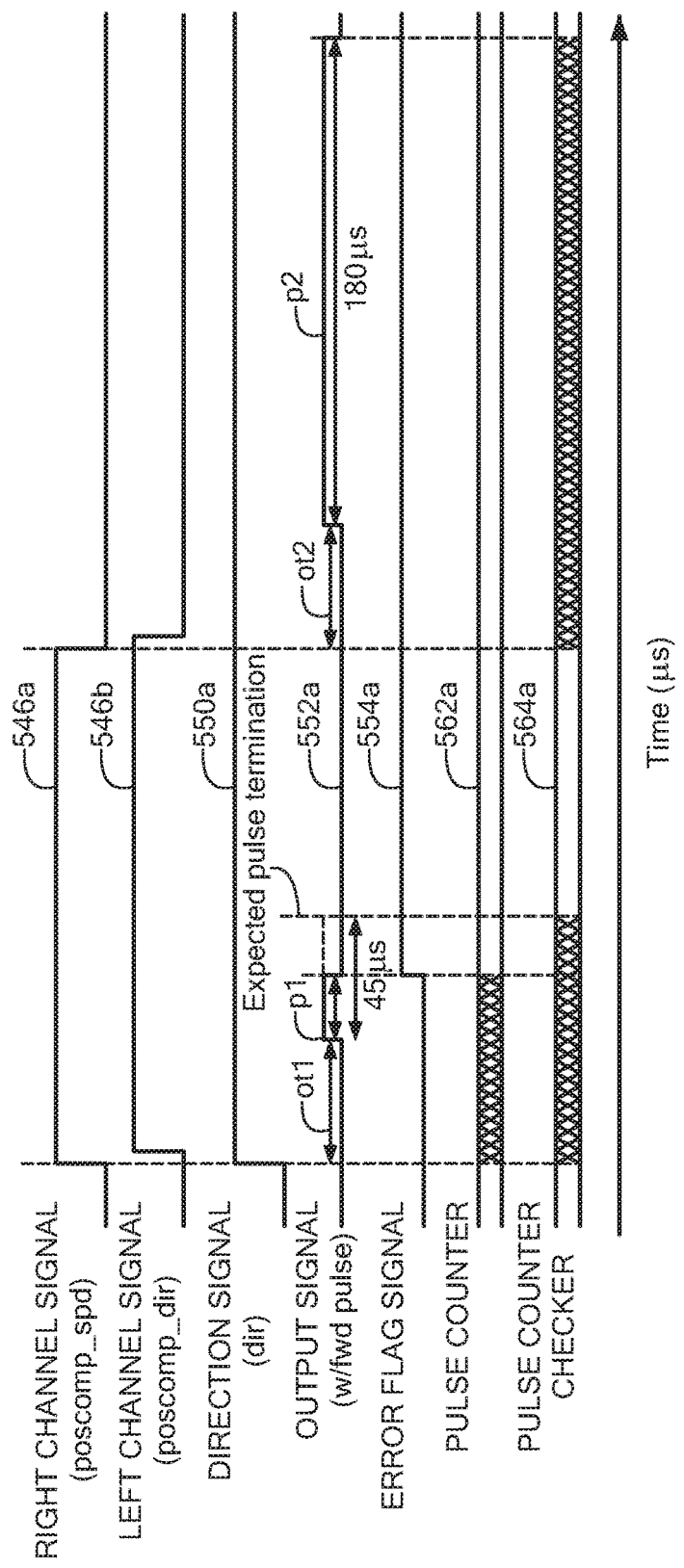
FIG. 5 shows illustrative signal waveforms generated by the magnetic field sensor of FIG. 1 in response to an error in an output signal in accordance with an embodiment.
Figure 5A:
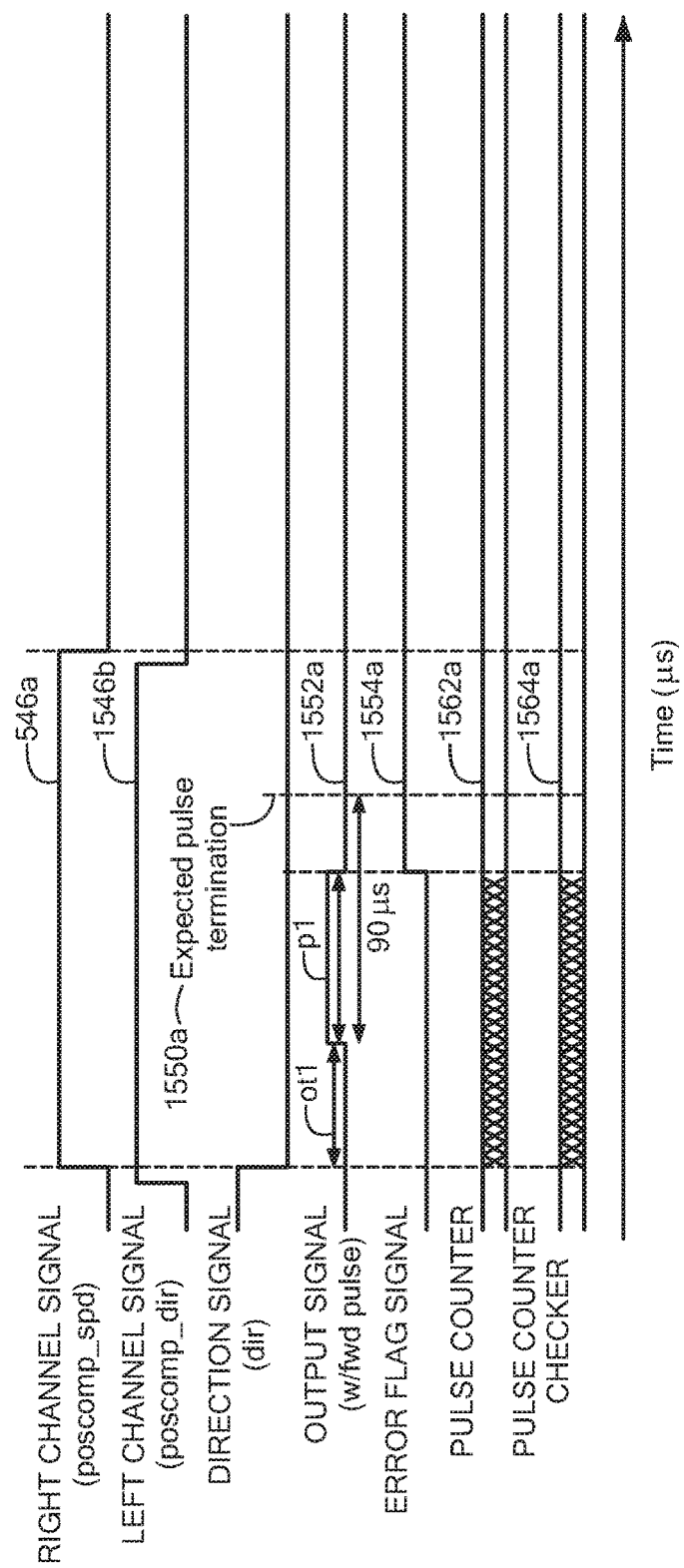
FIG. 5A shows illustrative signal waveforms generated by the magnetic field sensor of FIG. 1 in response to an error in an output signal and in accordance another embodiment.
Figure 5B:
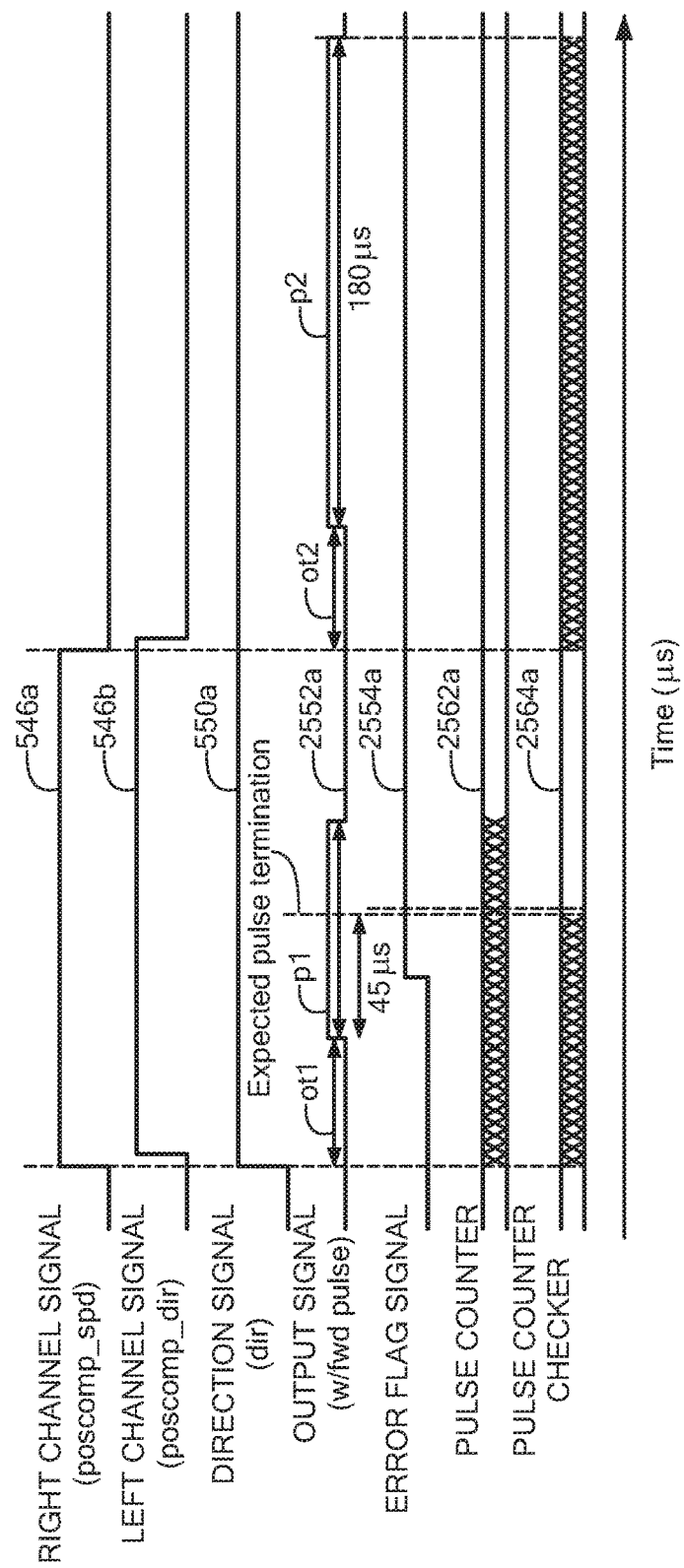
FIG. 5B shows illustrative signal waveforms generated by the magnetic field sensor of FIG. 1 in response to another error in the output signal and in accordance with yet another embodiment.

Referring to FIGS. 4-5B, illustrative signal waveforms as may be generated by a magnetic field sensor, which can be the same as or similar to magnetic field sensor 110 shown in FIG. 1, are shown. Each of the FIGS. 4-5B shows a right channel signal representative of an example right channel signal (e.g., 246a, shown in FIG. 2) generated by the magnetic field sensor at block 305 of method 300 shown in FIG. 3, for example and a left channel signal representative of an example left channel signal (e.g., 246b, shown in FIG. 2) generated by the magnetic field sensor at block 310 of method 300, for example. Each of FIGS. 4-5B also shows a direction signal representative of an example direction signal (e.g., 250a, shown in FIG. 2) generated by the magnetic field sensor at block 325 or block 330 of method 300 and an output signal representative of an example output signal (e.g., 252a, shown in FIG. 2) generated by the magnetic field sensor at block 340 of method 300, for example. An error flag signal representative of an example error flag signal (e.g., 254a, shown in FIG. 2) generated by the magnetic field sensor at block 355 of method 300 is also shown.

FIGS. 5-5B additionally show a pulse counter signal representative of an example pulse counter signal (e.g., from pulse counter 262, shown in FIG. 2) as may be generated by the magnetic field sensor at block 340 of method 300. Also shown in FIGS. 5-5B is a pulse counter checker signal representative of an example pulse counter checker signal (e.g., 264a, shown in FIG. 2) as may be generated by the magnetic field sensor at blocks 325 or 330 of method 300.

Referring to FIG. 4, during a time period t0, the right channel signal 446a leads the left channel signal 446b. As discussed above, a relative lag or lead of like edges of the right and left channel signals can be used to determine a direction of motion. The leading of the right channel signal 446a with respect to the left channel signal 446b can, for example, be indicative of a first direction of motion (e.g., a reverse direction of motion). During a time period t1, however, the right channel signal 446a lags the left channel signal 446b, which can be indicative of a second direction of motion (e.g., a forward direction of motion) in accordance with an embodiment. The direction signal 450a has a state indicative of the direction of motion of the object 112 (FIG. 1) and can be provided in a first state (e.g., a logic low) when the object moves in the first (e.g., reverse) direction and in a second state (e.g., a logic high) when the object moves in the second (e.g., forward) direction. The direction signal 450a can be generated based on the state of one of the right and left channel signals 446a, 446b occurring when the other one of the signals 446b, 446a transitions. For example, the direction signal 450a can be provided in the first, logic low state to indicate a reverse direction of motion when the left channel signal 446b is at a logic high level as the right cannel signal 446a transitions in a predetermined direction (e.g. a rising edge) and conversely, the direction signal 450a can be provided in the second, logic high state to indicate a forward direction of motion when the left channel signal 446b is at a logic low level as the right channel signal 446a transitions in the predetermined direction.

As is apparent, in this manner of generating the direction signal 450a, the direction signal should transition only when the right channel signal 446a transitions in a predetermined direction and not at any other time. Thus, a direction signal transition occurring at any time other than coincident with a right channel signal transition 446b in the predetermined direction such as a rising edge can indicate an error. It will be appreciated that while a direction signal error is here, considered to occur if the direction signal transitions at any time other that coincident with a right channel signal transition of the predetermined direction, in other embodiments in which the direction signal is based on the state of the left channel signal occurrence at all transitions of the right channel signal, an error may be considered to occur if the direction signal transitions at any time other than coincident with any edge of the right channel signal.

The illustrated output signal 452a is provided in the form of a two state square-wave signal having a frequency proportional to the speed of rotation of the object 112 and pulses having a pulse width representative of the direction of the rotation of the object. The output signal pulses p1, p2 for example, are asserted at transitions of one of the left and right channel signals (and here at transitions of the right channel signal) and thus have a frequency representative of the speed of motion of the object. Various predetermined pulse widths may be used to indicate direction information. As one example, a pulse width of 90 μs can indicate a first (e.g., reverse) direction of motion and a pulse width of 45 μs can indicate a second (e.g., forward) direction of motion. These predetermined pulse widths can be preset in the pulse counter (e.g., 262, shown in FIG. 2) for example. Additional pulse widths may be predetermined and used to is communicate different information. As one example, a third pulse width, such as 180 μs, is used to convey an error, as will be described.

It will be appreciated that the particular pulse widths selected to indicate different direction information and/or error or other information can be readily varied to suit a particular application. It will also be appreciated that the designations of "forward" and "reverse" motion as well as the particular logic levels or signal states used are arbitrary and readily varied without departing from the spirit of the disclosure.

As noted above, the direction signal 450a should transition only when the right channel signal 446a transitions in a predetermined direction and not at any other time. Consideration of a transition 404 of the direction signal 450a reveals that this direction signal transition is coincident with a rising edge 402 of the right channel signal 446a as expected. However, direction signal transition 414 is not coincident with a rising edge of the right channel signal 446a. As a result, an error is determined to have occurred when the direction signal transition 414 occurs, such as may be determined by comparing edges of the direction signal with transitions of the right channel signal, with edge comparator 266 of FIG. 2. Error flag signal 454a is asserted at 416 in response to detection of the error, such as by the error flag generator 268 of FIG. 2.

Various schemes are possible to communicate the detected error. In the embodiment illustrated by FIG. 4, the output signal 452a is pulled to a logic high level in response to assertion of the error flag signal 454a, as shown. Other schemes for communicating a detected error in the output signal are possible without departing from the spirit of the disclosure.

Figure 4A:
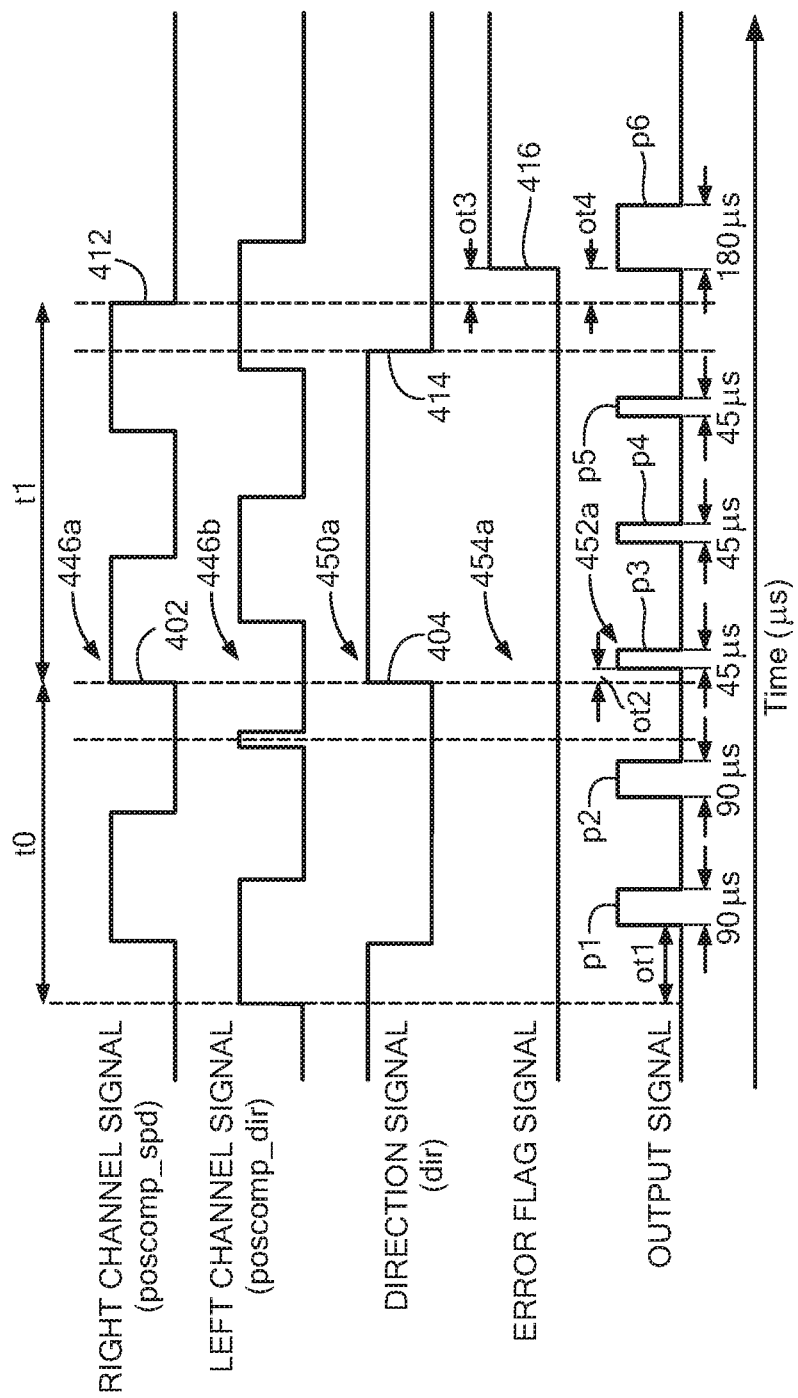
FIG. 4A shows illustrative signal waveforms generated by the magnetic field sensor of FIGS. 1 and 2 in response to an error in a direction signal and in accordance with another embodiment.

Referring to FIG. 4A, in which like signals and features with respect to FIG. 4 have like reference designations, the right channel signal 446a, the left channel signal 446b, and the direction signal 450a are identical to the signal portions shown in FIG. 4. Thus, during a time t0, the right channel signal lags the left channel signal indicating a first direction of motion and thereafter, during a time t1, the right channel signal leads the left channel signal, as is indicative of a direction change to the second direction of motion. Here again, the direction signal 450a transition 404 is coincident with a positive-going right channel signal transition 402, but the direction signal transition 414 is not coincident with a positive-going right channel signal transition and thus, indicates an error.

In the embodiment illustrated by FIG. 4A, the error flag signal 454a is asserted at some time after the error occurs (i.e., after direction signal transition 414). As one example, the error flag signal 454a is asserted during the next cycle of the right channel signal 446a so that speed information of the object (e.g., 112, shown in FIG. 1) can still be conveyed (e.g., through edges of the right channel signal 446a) even after an error is detected and then, after the occurrence of a predetermined off time ot3. In one aspect, the purpose of the predetermined off time is to ensure that at fast speeds, output signal pulses cannot overlap.

The error indicating pulse p6 illustrates a different manner of communicating the detected error than the scheme show in FIG. 4; namely the output signal 452a is provided with an error indicating pulse p6 at a predetermined off time ot4 following the start of the cycle following the cycle when the error was detected. With this particular error reporting scheme of providing an error indicating pulse p6, the output signal 452a can still convey speed information by the intervals between output signal pulses (e.g., between pulses p1 and p2) while direction information, which is typically conveyed by the width of output signal pulses (e.g., 45 μs or 90 μs pulse widths), can be disregarded. It will be appreciated that like the pulse widths representing forward and reverse motion, the error indicating pulse width can be varied and need only differentiate the error condition from other pulse width conveyed information. It will also be appreciated that the off time ot4 can be the same as or different than the off time ot3 associated with the error flag.

Referring to FIG. 5, example signals produced by a magnetic field sensor, which can be the same as or similar to magnetic field sensor 110 of FIG. include a pulse counter signal 562a and a pulse counter checker signal 564a in addition to a right channel signal 546a, a left channel signal 546b, a direction signal 550a, an output signal 554a, and an error flag signal 554a. Such can, for example, be representative of signals generated by a magnetic field sensor including a pulse counter (e.g., 262, shown in FIG. 2) and a pulse counter checker (e.g., 264, shown in FIG. 2).

In the example of FIG. 5, an edge of the right channel signal 546a lags a corresponding edge of the left channel signal 546b which may be indicative of a second direction of motion (e.g., a forward direction of motion). Additionally, an edge of the right channel signal 546a coincides with an edge of the direction signal 550a as expected. Here, however, the output signal 552a, which should have pulses with a pulse width corresponding to the second direction of rotation, has a pulse p1 that terminates prematurely. In particular, in an embodiment, pulse p1 should have a pulse width of 45 μs corresponding to the second direction of rotation. Here, however, pulse p1 terminates prematurely (i.e., before the expected pulse termination). In one embodiment, the premature termination of pulse p1 is detected by comparing the pulse counter signal 562a with the pulse counter checker signal 564a and determining a premature termination of pulse p1 if the pulse counter signal 562a has a duration that is less than the pulse counter checker signal 564a. The premature termination of pulse p1 can also be detected by checking a duration of the pulse counter checker signal 564a against an expected duration based on the direction signal 550a and one or more parameters such as output signal pulse duration, which may, for example, be stored in a memory device (e.g., 260, shown in FIG. 2) as discussed above.

As shown in FIG. 5, the error flag signal 554a is asserted substantially immediately (i.e., one clock cycle) after an error is detected. Moreover, as also shown in FIG. 5, the output signal 552a produces an error indicating p2 pulse with a pulse width of 180 μs after a predetermined time (i.e. during the next cycle of the right channel signal and thereafter, after a predetermined off time ot2 occurs), which according to some embodiments indicates an error with the output signal 552a. It should of course be appreciated that the magnetic field sensor (e.g., 110, shown in FIG. 1) may indicate an error in the output signal 552a in other manners as apparent.

In FIG. 5A, in which like signals of FIG. 5 are shown having like reference designations, the output signal, here denoted as output signal 1552a should have a pulse with a pulse width corresponding to a first direction of rotation (e.g., a 90 µs pulse width) since an edge of the right channel signal 546a leads a corresponding edge of the left channel signal 1546b. However, in contrast, the output signal 1552a has a pulse p1 that terminates prematurely. This premature termination of the pulse p1 causes the error flag signal 1554a to be asserted, which in turn causes the error to be communicated in the output signal 1552a. In particular, in the example embodiment shown, both the error flag signal 1554a and the output signal 1552a are asserted substantially immediately after (e.g., a clock cycle after) detection of the error (i.e., similar to the error reporting scheme of FIG. 4).

In instances where one of the pulse counter (e.g., 262, shown in FIG. 2) or the pulse counter checker (e.g., 264, shown in FIG. 2) is not operating as expected (e.g., due to counter failure), the magnetic field sensor (e.g., 110, shown in FIG. 1) can, for example, compare a counter signal (e.g., pulse counter signal 1562a or pulse counter checker signal 1564a) produced by a counter that is operating as expected (e.g., pulse counter 262 or pulse counter checker 264, shown in FIG. 2) with an expected duration of a corresponding pulse of the output signal 1562a to determine an error. Additionally, in instances where the pulse counter (e.g., 262, shown in FIG. 2) is not operating as expected (e.g., due to counter failure), the pulse counter checker (e.g., 264, shown in FIG. 2) can perform the functionality of the pulse counter (e.g., 262, shown in FIG. 2) and, thus, set the width of the output signal pulses (e.g., through the error flag signal 1554a or otherwise).

Referring to FIG. 5B, in which like signals of FIG. 5 are shown having like reference designations, the output signal 2552a, instead of having a pulse that terminates prematurely, here has a pulse p1 that remains high for a period longer than an expected pulse width. In particular, instead of the output signal 2552a having pulse with a pulse width of 45 µs, the output signal 2552a has a pulse p1 with a pulse width that is greater than 45 µs. Here again the error can be detected by comparing the pulse counter signal 2562a with the pulse counter checker signal 2564a and determining that the pulse counter signal 2562a has a count value that is greater than the count value pulse counter checker signal 2564a. Additionally, similar to the error detection scheme of FIG. 5, the error can be detected by checking a duration of the pulse counter checker signal 2564a against an expected duration based on the direction signal 550a and one or more parameters (e.g., output signal pulse duration) that may be stored in a memory device (e.g., 260, shown in FIG. 2). Further, similar to the error reporting scheme of FIG. 5 (and different from the error reporting scheme of FIG. 5A), the error is indicated by asserting the error flag signal 2554a substantially immediately after (i.e., one clock cycle after) detecting the error and by providing an output signal 2552a with an error indication pulse p2 having a pulse width of 180 µs during the next cycle of the right channel signal 546a and then after a predetermined off time ot2 has occurred. It should of course be appreciated that alternate error reporting schemes (e.g., error reporting through error flag signal, output signal, output pin, or otherwise with or without delays) than those disclosed above may be implemented with the embodiments disclosed herein.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

Having described preferred embodiments, which serve to illustrate various concepts, structures and techniques, which are the subject of this patent, it will now become apparent to those of ordinary skill in the art that other embodiments incorporating these concepts, structures and techniques may be used.

It will be appreciated that while some embodiments are described in which the detected motion of an object is rotation, the circuits and techniques described herein are applicable to other types of motion linear motion of an object.

Accordingly, it is submitted that that scope of the patent should not be limited to the described embodiments but rather should be limited only by the spirit and scope of the following claims.

What is claimed is:

1. A magnetic field sensor for detecting motion of an object, comprising:
    a plurality of magnetic field sensing elements configured to generate at least two magnetic field signals in response to a magnetic field associated with the object;
    a first detector circuit responsive to at least one of the magnetic field signals and configured to generate a right channel signal having edges indicative of motion of the object;
    a second detector circuit responsive to at least one of the magnetic field signals and configured to generate a left channel signal having edges indicative of motion of the object;
    a direction calculation processor responsive to the right and left channel signals to generate a direction signal having a state indicative of a direction of motion of the object, wherein the direction signal is generated in response to a predetermined state of the left channel signal occurring at an edge of the right channel signal;
    an output signal generator responsive to the direction signal to generate an output signal having a pulse indicative of the direction of motion of the object; and
    an error detection processor responsive to the output signal and to the direction signal to detect an error in the direction signal based on an edge of the direction signal not occurring at an edge of the right channel signal.

2. The magnetic field sensor of claim 1, wherein the output signal generator comprises a pulse counter configured to generate the output signal pulse with a first predetermined duration to indicate a first direction of motion when the direction signal is in a first state and to generate the output signal pulse with a second predetermined duration to indicate a second direction of motion when the direction signal is in a second state.

3. The magnetic field sensor of claim 1, wherein the error detection processor comprises an edge comparator responsive to the direction signal and to the right channel signal to provide a comparator output signal indicative of whether an edge of the direction signal coincides with an edge of the right channel signal.

4. The magnetic field sensor of claim 2, wherein the error further comprises an error in the output signal comprising the output signal pulse not having one of the first predetermined duration or the second predetermined duration corresponding to the direction of motion of the object.

5. The magnetic field sensor of claim 4, wherein the error detection processor comprises a pulse counter checker responsive to the direction signal and to the output signal and configured to generate a pulse count checker signal having a count value corresponding to the one of the first predetermined duration or the second predetermined duration corresponding to the direction of motion of the object.

6. The magnetic field sensor of claim 5, wherein the error detection processor further comprises an error flag generator to generate an error flag signal in response to the output signal pulse having a duration that does not correspond to the count value of the pulse counter checker signal.

7. The magnetic field sensor of claim 1, wherein the output signal generator further comprises a memory device.

8. The magnetic field sensor of claim 7, wherein the memory device is configured to store one or more parameters comprising an output signal pulse duration, an error reporting type, and an output signal off-time.

9. The magnetic field sensor of claim 8, wherein at least one of the stored parameters is user programmable.

10. The magnetic field sensor of claim 1, wherein the object is comprised of a magnetic material and wherein the magnetic field is generated by the object.

11. The magnetic field sensor of claim 1, wherein the object is comprised of a ferromagnetic material and wherein the magnetic field is affected by movement of the object.

12. The magnetic field sensor of claim 11, further comprising a magnet and wherein the magnetic field is generated by the magnet.

13. The magnetic field sensor of claim 1, wherein the plurality of magnetic field sensing elements are Hall effect elements.

14. The magnetic field sensor of claim 1, wherein the plurality of magnetic field sensing elements are magnetoresistance elements.

15. The magnetic field sensor of claim 14, wherein each of the magnetoresistance elements is one of: an anisotropic magnetoresistance (AMR) element, a giant magnetoresistance (GMR) element, a tunneling magnetoresistance (TMR) element, a magnetic tunnel junction (MTJ) element, or a spin valve element.

16. The magnetic field sensor of claim 1, wherein the error further comprises an error in the output signal, wherein the output signal produces an error indicating pulse with a predetermined pulse width after a predetermined time period, and at least one of the predetermined pulse width and the predetermined time period is indicative of an error with the output signal.

17. A method for detecting an error in a magnetic field sensor for detecting motion of an object, comprising:

receiving at least two magnetic field signals generated in response to a magnetic field associated with the object;

generating a right channel signal having edges indicative of motion of the object in response to at least one of the magnetic field signals;

generating a left channel signal having edges indicative of motion of the object in response to at least one of the magnetic field signals;

generating a direction signal having a state corresponding to a first or second direction of motion of the object in response to the right and left channel signals;

generating an output signal having a pulse with a first preset pulse duration corresponding to a first direction of motion of the object when the direction signal is in a first state, and with a second preset pulse duration different than the first preset pulse duration and corresponding to a second direction of motion of the object when the direction signal is in a second state; and detecting an error in the output signal, wherein the error comprises the output signal having a pulse duration other than the first preset pulse duration and other than the second preset pulse duration, by determining if the output signal pulse does not have one of the first and second preset pulse durations.

18. The method of claim 17, wherein detecting the error further comprises detecting the error in the direction signal if an edge of the direction signal does not coincide with an edge of the right channel signal.

19. A magnetic field sensor for detecting motion of an object, comprising:

a plurality of magnetic field sensing elements configured to generate at least two magnetic field signals in response to a magnetic field associated with the object;

means for generating a right channel signal having edges indicative of motion of the object in response to at least one of the magnetic field signals;

means for generating a left channel signal having edges indicative of motion of the object in response to at least one of the magnetic field signals;

means for generating a direction signal having a state indicative of a first or second direction of motion of the object in response to the right and left channel signals, wherein the direction signal is generated in response to a predetermined state of the left channel signal occurring at an edge of the right channel signal;

means for generating an output signal having a pulse with a first preset duration to indicate a first direction of motion of the object when the direction signal is in a first state, and with a second preset duration to indicate a second direction of motion of the object when the direction signal is in a second state;

means for detecting an error in the output signal if the output signal pulse does not have one of the first and second preset durations corresponding to the direction of motion of the object; and means for detecting an error in the direction signal based on an edge of the direction signal not occurring at an edge of the right channel signal.

* * * * *

UNITED STATES PATENT AND TRADEMARK OFFICE
CERTIFICATE OF CORRECTION

PATENT NO. : 10,156,461 B2
APPLICATION NO. : 14/529497
DATED : December 18, 2018
INVENTOR(S) : Steven E. Snyder et al.

It is certified that error appears in the above-identified patent and that said Letters Patent is hereby corrected as shown below:

In the Specification

Column 1, Line 39, delete "as a Ferromagnetic" and replace with --of a Ferromagnetic--

Column 1, Line 40, delete "incorporate herein" and replace with --incorporated herein--

Column 3, Line 48, delete "circuit the" and replace with --circuit of the--

Column 3, Line 66, delete "accordance another" and replace with --accordance with another--

Column 6, Line 21, delete "only magnetic field" and replace with --only one magnetic field--

Column 6, Line 45, delete "circuit generates" and replace with --circuit 136b generates--

Column 7, Lines 50-51, delete "and the output signal 152 and the output signal 152" and replace with --and the output signal 152 and--

Column 9, Line 15, delete "edge comparator 266a" and replace with --edge comparator 266--

Column 9, Line 63, delete "error may indicated" and replace with --error may be indicated--

Column 10, Line 20, delete "as may be to" and replace with --as may be referred to--

Column 11, Line 32, delete "indicative an error" and replace with --indicative of an error--

Column 12, Line 57, delete "other that" and replace with --other than--

Column 13, Line 12, delete "used to is" and replace with --used to--

Column 14, Line 5, delete "scheme show" and replace with --scheme shown--

Signed and Sealed this
Nineteenth Day of February, 2019

Andrei Iancu
*Director of the United States Patent and Trademark Office*

CERTIFICATE OF CORRECTION (continued)
U.S. Pat. No. 10,156,461 B2

Column 14, Line 25, delete "FIG. include" and replace with --FIG. 1 include--

Column 14, Line 28, delete "output signal 554a" and replace with --output signal 552a--